(12) United States Patent
Chang

(10) Patent No.: US 7,209,365 B2
(45) Date of Patent: Apr. 24, 2007

(54) CARD RETENTION DEVICE

(75) Inventor: Lin-Wei Chang, Taipei (TW)

(73) Assignee: Inventec Corporation, Taipei (TW)

( * ) Notice: Subject to any disclaimer, the term of this patent is extended or adjusted under 35 U.S.C. 154(b) by 38 days.

(21) Appl. No.: 11/099,590

(22) Filed: Apr. 6, 2005

(65) Prior Publication Data

US 2006/0227520 A1   Oct. 12, 2006

(51) Int. Cl.
    *H05K 7/14* (2006.01)
(52) U.S. Cl. .................. 361/801; 361/759; 361/802; 361/756
(58) Field of Classification Search .......... 361/797, 361/790, 800, 801, 802, 737, 683, 686, 759, 361/756, 752–753
    See application file for complete search history.

(56) References Cited

U.S. PATENT DOCUMENTS 5,548,486 A * 8/1996 Kman et al. ............ 361/791
6,147,878 A * 11/2000 Heselton ................ 361/798
6,266,248 B1 * 7/2001 Hanas et al. ............ 361/752
6,411,517 B1 * 6/2002 Babin .................... 361/759
6,618,270 B2 * 9/2003 Babin et al. ............ 361/818
6,791,843 B1 * 9/2004 Dobbs et al. ........... 361/758
6,884,096 B2 * 4/2005 Centola et al. ......... 439/157
6,967,487 B2 * 11/2005 Garnett .................. 324/537

* cited by examiner

*Primary Examiner*—Tuan Dinh
*Assistant Examiner*—Abiy Getachew
(74) *Attorney, Agent, or Firm*—Rabin & Berdo, P.C.

(57) ABSTRACT

A card retention device includes a latch member pivotally coupled on a side wall which is located in a chassis of a computer and is located corresponding to a distal end of an expansion card. The latch member includes a stem which has a first latch section and a second latch section on two ends. The first latch section is a stub to latch the upper edge of the distal end of the expansion card. The second latch section may be coupled with a third latch section formed on the side wall to enable the latch member to latch the expansion card and prevent the expansion card from becoming disengaging from the expansion slot where it is engaged.

7 Claims, 5 Drawing Sheets

CARD RETENTION DEVICE

FIELD OF THE INVENTION

The present invention relates to a retention device for preventing expansion cards from becoming disengaged from expansion slots, and particularly to a card retention device that is simply structured to hold the expansion cards individually.

BACKGROUND OF THE INVENTION

A fully functioned computer, besides including a CPU, memory and logic chip sets on a mainboard, also has to include peripheral devices that are coupled with the mainboard through various I/O interfaces to expand the function of the computer.

In large computer equipment such as the hosts of network servers or industrial servers, in addition to providing more powerful performance than the PCs, the peripheral devices also have to be equiped with enhanced performance to catch up with the server to meet the requirement of high loading. Hence the expansion cards installed on a large computer often are longer than the ones used on the PCs to contain more and larger chip sets, to process high loading and complex operations. The expansion cards used on the servers almost have the same length as the case of the servers. The expansion cards usually adopt PCI and ISA slots as connection interfaces. These expansion slots have limited coupling strength. Hence the expansion cards are prone to becoming disengaged from the expansion slots during assembly or transportation, and could cause defective contact and result in malfunction of the servers.

To prevent the expansion cards from becoming disengaged from the expansion slots, the conventional approach is to set various retention devices on the chassis. FIG. 1 illustrates a conventional expansion card retention device. There is a frame 1 located in a server chassis to form a card receiving area. The frame 1 includes a circuit board 2 and a plurality of expansion slots 3 on the bottom. A latch member 4 with a substantially L-shaped cross section is provided that has a hinge 4a and a latch section 4b. The hinge 4a is pivotally coupled on a front wall of the frame 1 and may be swiveled close to the front side wall to move the latch section 4b to the upper edge of the front wall of the frame 1, and to extend the front edge of the latch section 4b towards the interior of the frame 1. After a plurality of expansion cards 5 are engaged in the expansion slots 3, the latch member 4 is swiveled to couple the latch section 4b on the upper edges of the distal ends of the expansion cards 5. The expansion cards S may be latched securely without becoming disengaged from the expansion slots.

The aforesaid retention device aims to couple a plurality of expansion cards 5. If the expansion cards 5 have different heights, they receive different pressure and the retention effect varies. When changing and replacing a single expansion card 5, the rest of the expansion cards 5 also have to be unlatched. It is not possible to change and latch the expansion cards 5 individually. Hence all expansion cards have to be inspected and tested anew after every change operation. Moreover, the latch member 4 is swiveled about an axis parallel with the front wall and moved close to the front wall, or moved away from the front wall. Such a coupling relationship has to reserve a sufficient operation space outside the front wall of the frame 1 to enable the latch member 4 to be swiveled as desired so that the expansion cards 5 may be latched or removed. Such a device does not efficiently utilize the interior space of the chassis.

SUMMARY OF THE INVENTION

In view of the aforesaid problems, the primary object of the present invention is to provide a card retention device that is easy to be operated and can securely hold the expansion cards to prevent the expansion cards from disengaged from the expansion slots.

Another object of the invention is to provide a card retention device that is simply structured and is able to be operated in a small space.

To achieve the foregoing objects, the card retention device according to the invention includes a frame located in a computer host and a latch member pivotally coupled on the frame. The latch member includes a stem which has a first latch section and a second latch section on two ends, and an axle. The first latch section is a stub extending from one side of the latch member. The frame has a housing space in the interior to hold at least one expansion card, and at least one sidewall corresponding to the expansion card to be close to or in contact with a distal end of the expansion card. The sidewall has a pivot hole and a third latch section. The axle of the latch member is engaged with the pivot hole to pivotally couple the latch member on the side wall so that the latch member may be swiveled relative to the sidewall about an axis normal to the side wall. The second latch section and the third latch section are respectively a latch hole and a protrusion that may be coupled to anchor the latch member so that the latch member can latch the expansion card securely.

The number of the latch member depends on the number of the expansion cards to be configured. Moreover, the length of the latch member and the length of the first latch section may be altered according to the dimension of the expansion cards so that expansion cards of different sizes may be effectively latched and anchored. In addition, the latch member is swiveled about an axis normal to the side wall, and is close to the side wall while swiveling. Hence there is no need to spare an operation space around the side wall for the latch member. The interior space of the chassis may be utilized more efficiently.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 1:
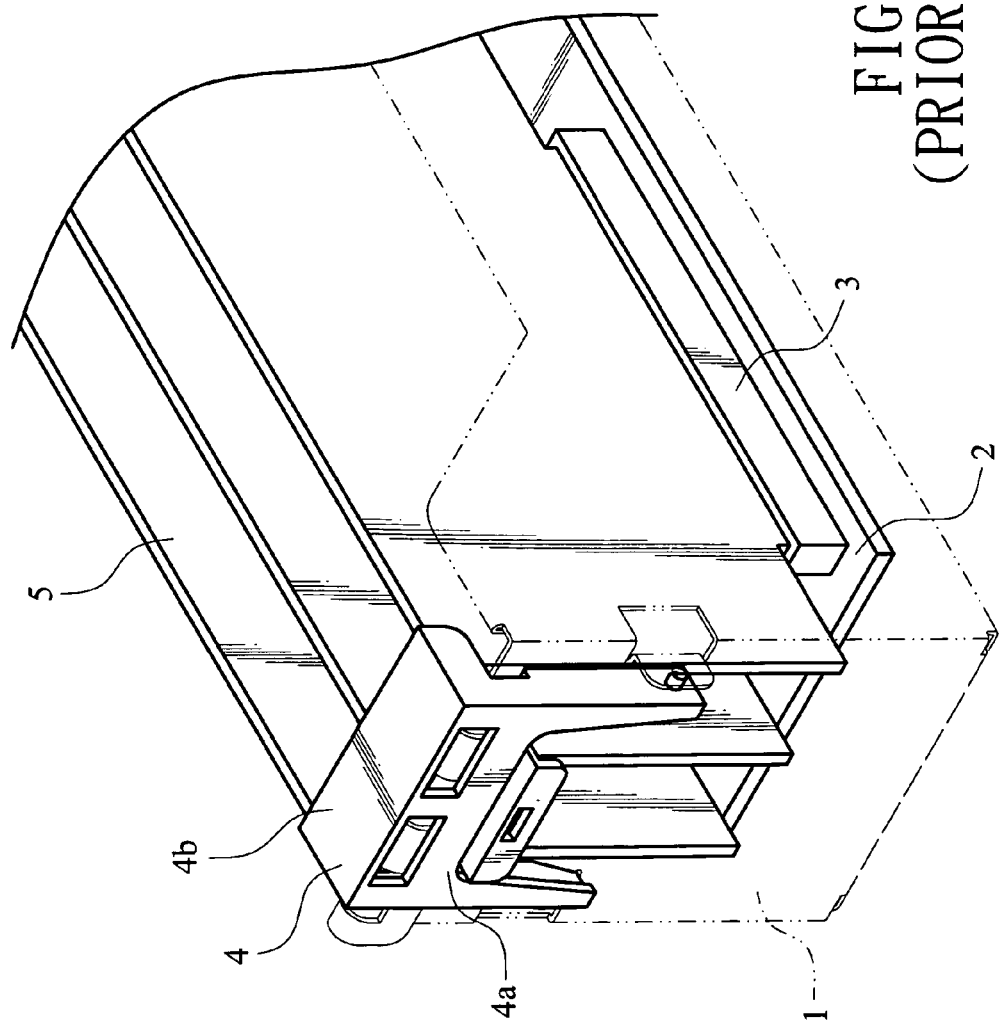
FIG. 1 is a perspective view of a conventional expansion card retention device.
Figure 2:
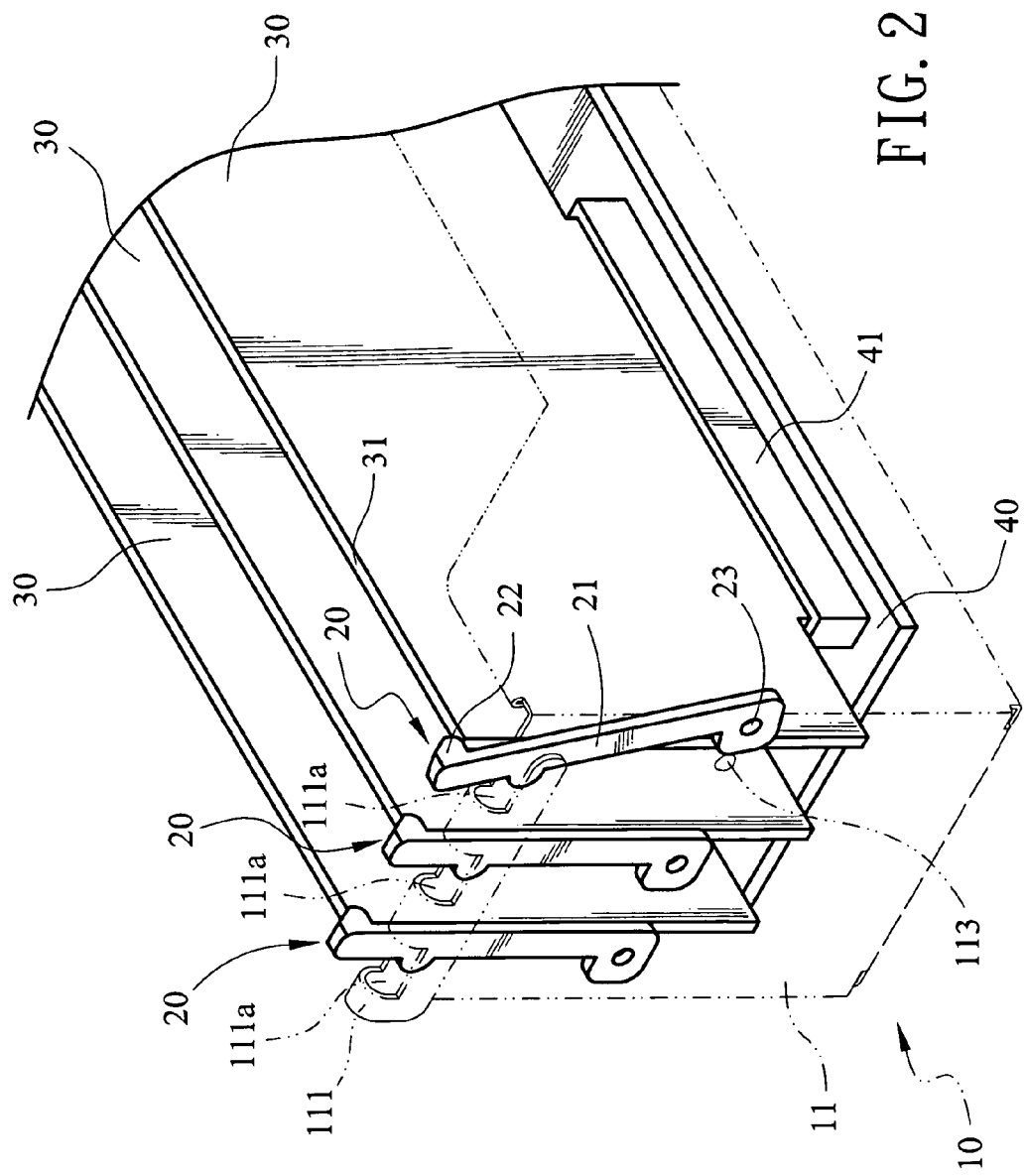
FIG. 2 is a perspective view of the computer expansion-card retention device of the invention.
Figure 3:
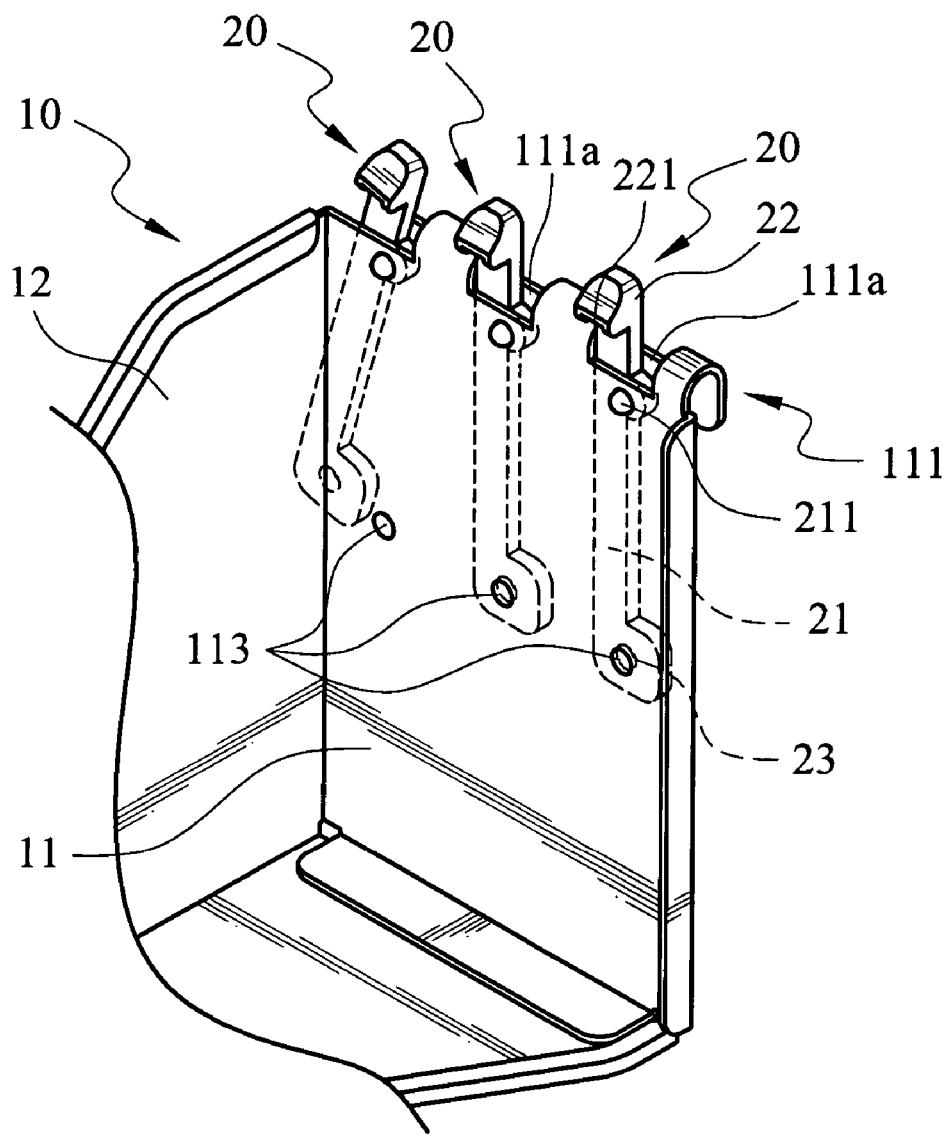
FIG. 3 is another perspective view of the computer expansion card retention device of the invention.

Referring to FIGS. 2 and 3, the card retention device of the invention includes a frame 10 and a plurality of latch members 20 that are hinged on the frame 10. The frame 10 is located in a computer chassis to form a receiving space to receive and protect a plurality of expansion cards 30. The frame 10 includes at least a first side wall 11 corresponding to a distal end of the expansion cards 30 and a second side wall 12 parallel with the expansion cards 30. There is a circuit board 40 located on the bottom of the frame 10 that has a plurality of expansion slots 41 to receive and hold the expansion cards 30 in the housing space of the frame 10. The distal end 31 of the expansion cards 30 is adjacent to (i.e. close to or in contact with the inner side of the first side wall 11. The circuit board 40 may be a computer main board or an interface expansion board connected to the main board through a flat cable. The circuit board 40 and the expansion slots 41 are elements known to those skilled in the art of computers, thus details are omitted.

Each of the latch members 20 aims to anchor one of the expansion cards 30. It latches on the upper edge of the distal end 31 of the expansion card 30 to form an anchor effect to prevent the expansion card from becoming disengaged from the expansion slot 41 during transportation, assembly and test of the chassis, or when the chassis is subject to impact of external forces or shaking.

To facilitate discussion, the following detailed description focuses on one latch member 20.

The latch member 20 has a stem 21 which includes a first latch section 22 and a second latch section 23 on two ends, and an axle 211 located proximate to a middle portion thereof.

The first side wall 11 has the upper portion bending outwards to form a retaining flange 111. The juncture of the first side wall 11 and the retaining flange 111 has an opening 111a corresponding to the latch member. The first side wall 11 further has a pivot hole 112 and a third latch section 113. The opening 111a, pivot hole 112 and third latch section 113 are located on a same straight line which is parallel with the expansion card 30 corresponding to the latch member 20. The pivot hole 112 is located between the opening 111a and the third latch section 113.

The latch member 20 is coupled on the first side wall 11 by engaging the axle 211 with the pivot hole 112. The stem 21 of the latch member 20 passes through the opening 111a so that the one end where the first latch section 22 is located is extended over the upper edge of the first side wail 11. The latch member 20 may be swiveled about an axis normal to the side wall 11. During swiveling, the latch member 20 is close to and parallel with the first side wall 11.

Figure 4:
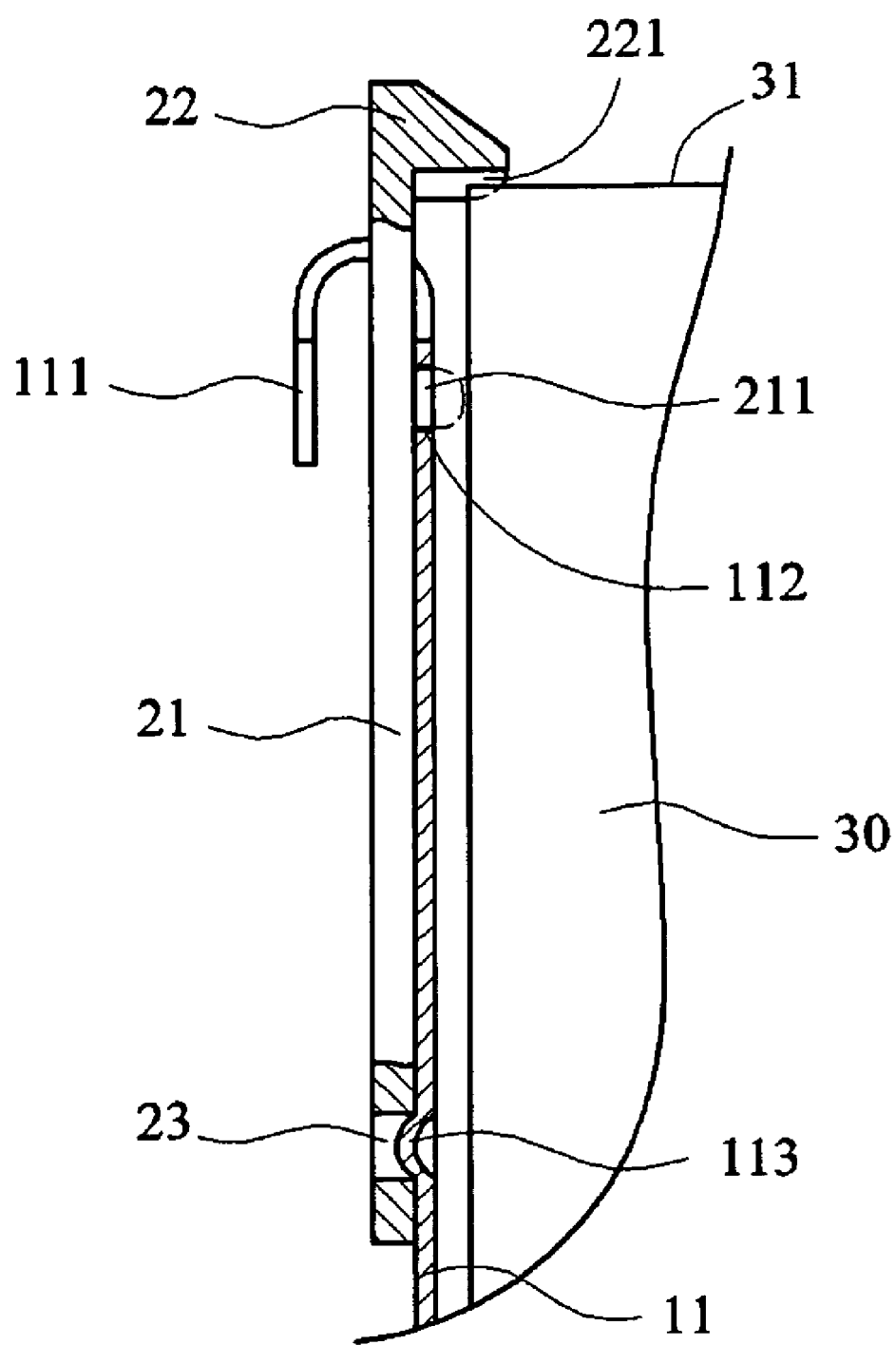
FIG. 4 is a sectional view of the invention.

Refer to FIG. 4 for a sectional view of the latch member 20 and the first side wall 11. The first latch section 22 is substantially a stub extending towards the interior of the frame 10 and has a latch notch 221 on an inner side facing the frame 1 to mate the distal end 31 of the expansion card 30 and latch the expansion card 30. The second latch section 23 of the latch member 20 may be latched on the third latch section 113 of the first side wall 11 to latch the latch member 20 so that the latch member 20 can latch the expansion card 30 securely and prevent the expansion card 30 from disengaging from the expansion slot 41.

The second latch section 23 and the third latch section 113 may be formed as a protrusion and a latch hole for coupling. In this embodiment, the second latch section 23 is latch hole formed on the latch member 20, while the third latch member 113 is a protrusion formed on an outer side of the first side wall 11 to be wedged in the second latch section 23, to prevent the latch member 20 from swiveling.

Figure 5:
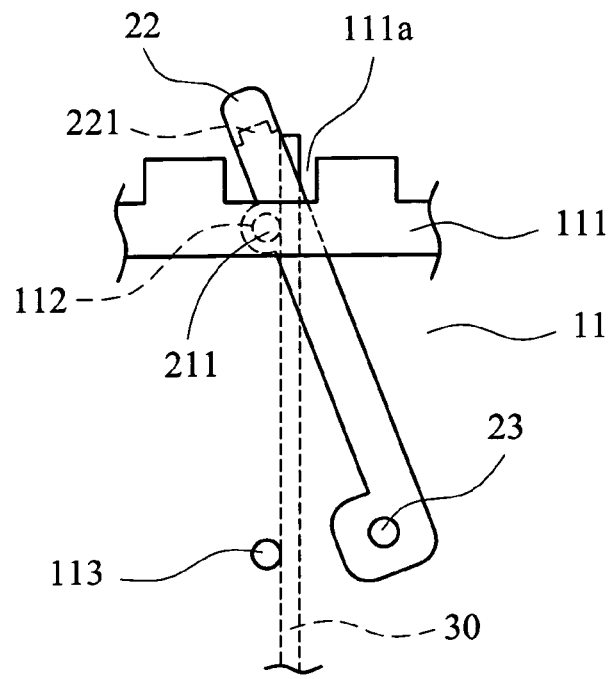
FIG. 5 is a front view of the invention showing the latch member which doesn't latch on the expansion card yet.
Figure 6:
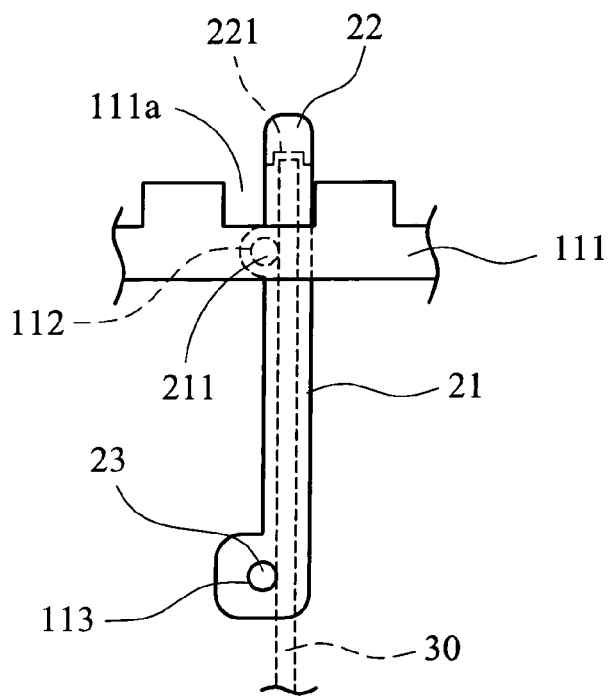
FIG. 6 is a front view of the invention showing the latch member has latched on the expansion card.

Refer to FIGS. 5 and 6 for the operations of the card retention device to latch the expansion card 30. First, insert the expansion card 30 in the expansion slot 41 of the frame 10; the distal end 31 of the expansion card 30 is close to the first side wall 11 corresponding to the latch member 20 while the latch member 20 is turned to form an angle with the expansion card 30, 50 that the first latch section 22 is located on one side of the expansion card 30 (referring to FIG. 5, the first latch section 22 is located on the left side of the expansion card 30); the opening 111a serves a retaining function to limit the swiveling angle of the latch member 20 to prevent the latch member 20 from swiveling too great an angle and to prevent from interfering the operation of the neighboring latch members 20; swivel the latch member 20 to move the first latch section 22 towards the expansion card 30 with the latch notch 221 covering the upper edge of the distal end 31 of the expansion card to form a latch condition so that the expansion card 20 cannot escape from the expansion slot 41; meanwhile, the second latch section 23 is coupled with the third latch section 113 to anchor the latch member 20. Therefore the latch member 20 can latch the expansion card 30 securely.

The embodiment previously discussed focuses on one latch member. In practice, the number of the latch member 20 may be configured according to the number of the expansion slot 41 and expansion card 30. The dimension of the stem 21 and the first latch section 22 may vary according to the size of the expansion card 30. The swiveling direction of the latch member 20 also is not restricted to the one shown in the drawings and the embodiment. For instance, the swiveling direction may be clockwise to release the expansion card 30, and counterclockwise to latch the expansion card 30. Moreover, in the embodiment, the first side wall 11 is part of the frame 10. In practice, the first side wall 11 may be an independent element located in the chassis, or be part of the chassis to form one side of the chassis. Accordingly, the appended claims are intended to cover all embodiments, which do not depart from the spirit and scope of the invention.

What is claimed is:

1. A card retention device for latching an expansion card firmly in a chassis of a computer, to prevent the expansion card from becoming disengaged from an expansion slot of the computer, which comprises:
   a latch member including a stem which has a first latch section and a second latch section on two ends thereof, and an axle disposed between the first latch section and the second latch section, the first latch section being a stub extending from one side of the latch member; and
   a side wall located in the chassis of the computer including a pivot hole and a third latch section;
   wherein the axle of the latch member is engaged with the pivot hole to pivotally couple the latch member to the side wall, so that the latch member may be swiveled about an axis normal to the side wall relative to the side wall and to a position where the first latch section is latched on one end of the expansion card to urge the expansion card into the expansion slot, and the second latch section and the third latch section are coupled together to anchor the latch member which in turn latches the expansion card; and
   wherein when the latch member is swiveled away from the position, the second latch section and the third latch section uncouple from each other, and the first latch section is moved away from the one end of the expansion card to allow the expansion card to be removed from the expansion slot.

2. A card retention device for latching an expansion card firmly in a chassis of a computer, to prevent the expansion card from becoming disengaged from an expansion slot of the computer, which comprises:

a latch member including a stem which has a first latch section and a second latch section on two ends thereof, and an axle, the first latch section being a stub extending from one side of the latch member; and a side wall located in the chassis of the computer including a pivot hole and a third latch section;

wherein the axle of the latch member is engaged with the pivot hole to pivotally couple the side wall, and swiveled about an axis normal to the side wall relative to the side wall, so that the first latch section is latched on one end of the expansion card, and the second latch section and the third latch section are coupled together to anchor the latch member which in turn latches the expansion card, and wherein the side wall has a upper portion bent to form a retaining flange, the side wall and the retaining flange having a juncture which forms an opening, the stem of the latch member passing through the opening such that the one end where the first latch section is located is extended over the upper edge of the side wall.

3. The card retention device of claim 2, wherein the opening, the pivot hole and the third latch section are located on a same straight line, the pivot hole being located between the opening and the third latch section.

4. The card retention device of claim 1, wherein the first latch section has a latch notch formed on one side corresponding to the expansion card.

5. The card retention device of claim 1, wherein the second latch section is a latch hole formed on the latch member, the third latch section being a bulged element formed on the side wall.

6. A card retention device, comprising:

a frame that accommodates an expansion card, and having a side wall having a latch section;

an elongated expansion slot that receives the expansion card therein, the expansion slot being disposed in said frame, and being longitudinally arranged to extend in a direction perpendicular to the side wall, so that when the expansion card is received in the expansion slot, the expansion card and the side wall will be perpendicular to each other; and a latch member that has a stem rotatably connected to said side wall at a pivot point, the latch member being rotatable about the pivot point in a plane that is parallel to the side wall, said latch member having a first latch section disposed on one end of the stem, and a second latch section disposed on another end of the stem, with the first and second latch sections being separated by the pivot point, the first latch section including a stub that projects in a direction away from the side wall;

wherein when the latch member is rotated to a predetermined position, the stub will project over an edge of the expansion card, to retain the expansion card in the expansion slot, and the second latch section of said latch member will engage with the latch section of the side wall, to help retain the latch member in the predetermined position, and wherein when the latch member is rotated from the predetermined position, the second latch section of said latch member will disengage from the latch section of the side wall, and the stub will move away from the upper edge of the expansion card, to allow the expansion card to be removed from the expansion slot.

7. The card retention device recited in claim 6, wherein the predetermined position is a vertical position, and the edge of the expansion card is an upper edge.

* * * * *